United States Patent [19]

Weng et al.

[11] Patent Number: 5,528,607
[45] Date of Patent: Jun. 18, 1996

[54] METHOD AND APPARATUS FOR PROTECTING DATA FROM MIS-SYNCHRONIZATION ERRORS

[75] Inventors: Lih-Jyh Weng, Shrewsbury; Bruce Leshay, West Boyalston; Diana Langer, Northboro, all of Mass.

[73] Assignee: Quantum Corporation, Milpitas, Calif.

[21] Appl. No.: 383,201

[22] Filed: Feb. 2, 1995

[51] Int. Cl.$^6$ ............................ G11B 20/18; H03M 13/00
[52] U.S. Cl. ............................................... 371/42; 371/40.1
[58] Field of Search ........................... 371/37.1, 42, 40.1

[56] References Cited

U.S. PATENT DOCUMENTS

| | | | |
|---|---|---|---|
| 3,668,632 | 6/1972 | Oldham, III | 371/42 |
| 4,797,672 | 1/1989 | Kousa | 340/825.300 |
| 4,989,211 | 1/1991 | Weng | 371/42 |
| 5,107,503 | 4/1992 | Riggle et al. | 371/37.1 |

OTHER PUBLICATIONS

Glover, N., et al., "Practical Error Correction Design for Engineers", 2nd edition, Data Systems Technology Corp., pp. 256–269. Aug. 1988.

*Primary Examiner*—Stephen M. Baker
*Attorney, Agent, or Firm*—David B. Harrison

[57] ABSTRACT

An encoder in a data processing system generates, from a single m-bit coset leader constant, or symbol, a coset leader, which is a series of k m-bit symbols that resembles a random sequence of km bits. The encoder encodes the m-bit initial coset leader constant in a linear feedback shift register that is characterized by a maximum length polynomial over GF(2). The constants are produced by the register at the same times as the error correction symbols are produced by the encoder. The corresponding constants and symbols are then XOR'd together before the symbols are concatenated with the data symbols to form a code word for recording. A decoder similarly generates the coset leader from the initial constant. The decoder XOR's these constants with the error correction symbols in a retrieved code word as part of a demodulation operation. If the head was in synchronism with the stored information during a read operation, XOR'ing the k coset leader constants with the error correction symbols of the retrieved code word removes the coset leader from these symbols, and thus, reproduces the original error correction symbols. Otherwise, the XOR operation combines the coset leader with a shifted version of itself and introduces into the retrieved code word a number of errors that exceeds the error correction capability of the error correction code used to encode the data. In the preferred embodiment, the linear feedback shift register is characterized by the maximum length polynomial $X^9+X^8+X^7+X^3+X^2+1$ over GF(2), and the m-bit initial coset leader constant is 100001011.

17 Claims, 2 Drawing Sheets

METHOD AND APPARATUS FOR PROTECTING DATA FROM MIS-SYNCHRONIZATION ERRORS

FIELD OF THE INVENTION

This invention relates generally to data processing systems and more specifically to a system for ensuring that a mis-synchronization between a read head of a magnetic disk drive and information stored in the drive does not result in erroneous data retrieval.

BACKGROUND OF THE INVENTION

Digital data processing systems typically include data storage devices, for example, disk drives. Data is recorded on the disks in concentric tracks, and each track is divided into a number of "contiguous" sectors, often with gaps separating one or more of the sectors. Data is retrieved (read) from or stored (written) in the sectors by a read/write head. As the disk rotates under the head, data is, for example, read from a particular sector when the head is over that sector.

To begin a read or write operation the head is moved to the track containing the selected sector. Unless the head was used in the immediately preceding read or write operation, the head, or more specifically timer and clock circuitry associated with the read/write operation, must then be synchronized to the disk so that the information rotating under the head can be read. Once the circuitry is synchronized, the head locates the start of the appropriate sector and performs the read or write operation. If, for example, during a read operation, the start of a sector is not exactly located, inappropriate information read from the disk may be interpreted as data.

The data are typically stored on the disk in encoded form. Prior to recording, the data symbols are encoded using an error correction code (ECC). Encoding the data avoids the loss of information through misinterpretation of the retrieved data, should one or more of the data symbols become corrupted due, for example, to a defect in the disk or to noise signals in the read or write channels. The result of misinterpreting the retrieved data symbols is erroneous data, and the error correction code is employed to, as the name implies, correct the erroneous data.

Specifically, before a string of data symbols is written to a disk, it is mathematically encoded to form ECC symbols. The ECC symbols are then appended to the data string to form data code words—data symbols plus ECC symbols— and the data code words are written to, or stored on, the disk. When data are read from the disk, the code words containing the data symbols are retrieved and mathematically decoded. During decoding, errors in the data are detected and, if possible, corrected through manipulation of the ECC symbols [For a derailed description of decoding see Peterson and Weldon, *Error Correction Codes,* 2d Edition, MIT Press, 1972].

Reed Solomon codes are often used as ECCs for data recorded on disks. The Reed Solomon codes are cyclic codes, which means that if $x_1, x_2, x_3 \ldots x_n$ is a code word, where $x_i$ are code word symbols, then $x_2, x_3 \ldots x_n, x_1$ is also a code word; $x_3, x_4 \ldots x_n, x_1, x_2$ is also a code word; and $x_3, x_4 \ldots x_n, x_{1*}, x_{2*}$ may be a code word, where $x_{1*}$ and $x_{2*}$ are, respectively, symbols adjacent to the code word, for example, the first and second symbols of a next code word.

As discussed above, the code words are recorded on the disk in the contiguous sectors. A head that is out of synchronism with the information recorded on the disk may start reading a code word after one or more bits or one or more symbols of that code word have rotated past the head. It thus finishes reading with one or more bits or symbols of the code word recorded in the next sector or with one or more bits of information recorded in a gap between the two sectors. If the mis-synchronization is by an integral number of symbols, the information read from the disk may form another code word. If so, a decoder can use the retrieved symbols to "correct" any erroneous symbols in this code word. The decoder forwards these error-free symbols to the system component that requested the data, and the system then further processes these symbols as if they are the requested data.

To prevent synchronization errors from resulting in the alteration of data, prior known systems have, before recording a code word, included in the ECC symbols a "coset leader." When the code word is later retrieved, the decoder removes the coset leader from the ECC symbols before it corrects the data symbols. As discussed below, the coset leader can be accurately removed from the retrieved information only if that information is the recorded code word. Otherwise, removing the coset leader will most likely result in the introduction of an uncorrectable number of errors, since the coset leader is "removed" from symbols other than the ECC symbols to which it was, for example, added.

The coset leader can be any sequence that does not belong to the code used to encode the data. If all possible code words are considered as a group, adding the coset leader to the ECC symbols in the code words, in effect, shifts the entire group by an amount "b." When the coset leader is later removed from the ECC symbols in each of the code words, the code words are shifted back by the same amount b to the original code words. If a code word is misread due to mis-synchronization of the head, the result of removing the coset leader from the ECC symbols shifts the codeword by an amount other than b, which usually results in the introduction of a uncorrectable number of errors into the code word.

The coset leader can be thought of as a sequence of patterns or values, one value for each of the ECC symbols in the code word. In some prior known systems, the coset leader consists of a series of identical patterns, for example, a series of 1's. The encoder thus adds (modulo 2) the same constant to each of the ECC symbols and the decoder removes that constant from each of the retrieved ECC symbols. The hardware required to handle the coset leader operation consists of an adder and a dedicated one-symbol-sized buffer.

Using the same pattern, or coset leader constant, for all of the ECC symbols does not yield as high a level of protection as using a coset leader that consists of a sequence of different patterns. If the coset leader consists of a repeated constant, it is conceivable that a mis-synchronization may result in information that decodes as a legitimate code word, that is, as a code word with a correctable number of errors. This may occur, for example, when the coset leader constant is correctly removed from many if not most of the retrieved ECC symbols. A mis-synchronization is more likely to result in the introduction of an uncorrectable number of errors when a sequence of different patterns is used as the coset leader.

There is a problem with using different patterns, namely, a significant amount of buffer space is required to store the patterns. If, for example, the code word contains k m-bit ECC symbols, the encoder requires k m-bit buffers. This is in contrast to the single m-bit buffer required in the systems that use the same constant for each of the ECC symbols. There is thus a trade-off between buffer space or chip "real estate" and the protection of data against mis-synchronization errors.

SUMMARY OF THE INVENTION

The invention is an encoder that generates, from a single coset leader constant, or symbol, a coset leader, which is a series of k m-bit symbols that resembles a random sequence. The encoder is initially set to an m-bit initial coset leader constant. It then encodes this constant to produce the (k−1) remaining m-bit coset leader constants. These constants are produced simultaneously with the ECC symbols and are combined, i.e., XOR'd, with the corresponding symbols before the symbols are concatenated with the data symbols to form a code word for recording. Accordingly, the k coset leader constants need not be stored in buffers.

The corresponding decoder similarly generates the coset leader from a stored initial constant. It XOR's these constants with the ECC symbols in a retrieved codeword as part of a demodulation operation. If the head that read the code word was in synchronism with the stored information, XOR'ing the k coset leader constants with the ECC symbols of the retrieved code word removes the coset leader from these symbols, and thus, reproduces the original ECC symbols. Otherwise, the XOR operation combines the coset leader with a shifted version of itself and introduces into the retrieved code word a number of errors that exceeds the error correction capability of the ECC.

When the code word is thereafter decoded, the decoder will not attempt to correct the data retrieved by a mis-synchronized head. It will instead label the data as uncorrectable.

Specifically, the encoder encodes the data symbols in accordance with an ECC over $GF(2^m)$, and produces k m-bit ECC symbols. The encoder includes, for encoding the constant, an m-stage linear feedback shift register (LFSR), which is set-up in accordance with a maximum length polynomial in GF(2). The LFSR is pre-set, or hardwired, to initialize to the selected initial coset leader constant. In the preferred embodiment the coset leader is encoded over GF(2), the initial coset leader constant is 100001011, and the encoder is set-up in accordance with the polynomial $X^9+X^8+X^7+X^3+X^2+1$.

To produce the ECC symbols, the encoder encodes the data symbols in a conventional manner using an ECC-symbol generator and produces, in k 9-bit registers, the k ECC symbols. When the first of the ECC symbols is shifted out of the generator, the LFSR is initialized, so that it contains the initial coset leader constant. The contents of the LFSR are then XOR'd with the first ECC symbol.

The LFSR is then shifted to update its contents in accordance with the polynomial set forth above. This produces in the stages of the LFSR a next coset leader constant, which is XOR'd with the next ECC symbol shifted out of the ECC symbol generator. This shifting and XOR'ing continues until each of the ECC symbols produced by the ECC-symbol generator has been combined with a corresponding coset leader constant produced in the LFSR.

The encoder next re-sets the LFSR to its initial condition for the next code word, and again encodes that constant to produce the k-symbol coset leader.

The corresponding decoder uses the same LFSR to produce the coset leader constants that are removed from a retrieved code word. The decoder also includes a demodulator, which demodulates retrieved information into code word symbols. As the demodulator shifts out the ECC symbols, the decoder XOR's them with the contents of the LFSR, shifting the LFSR to generate a succession of coset leader constants, as discussed above.

The hardware required to produce the coset/leader is minimized by using the hardwired LFSR. Accordingly, a k-symbol buffer is not needed. Further, there is no delay introduced into the encoding or decoding operations by the LFSR, since the LFSR supplies the coset leader constants to the XOR gate at the same times as the encoder or decoder supplies to the gate the corresponding ECC symbols.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
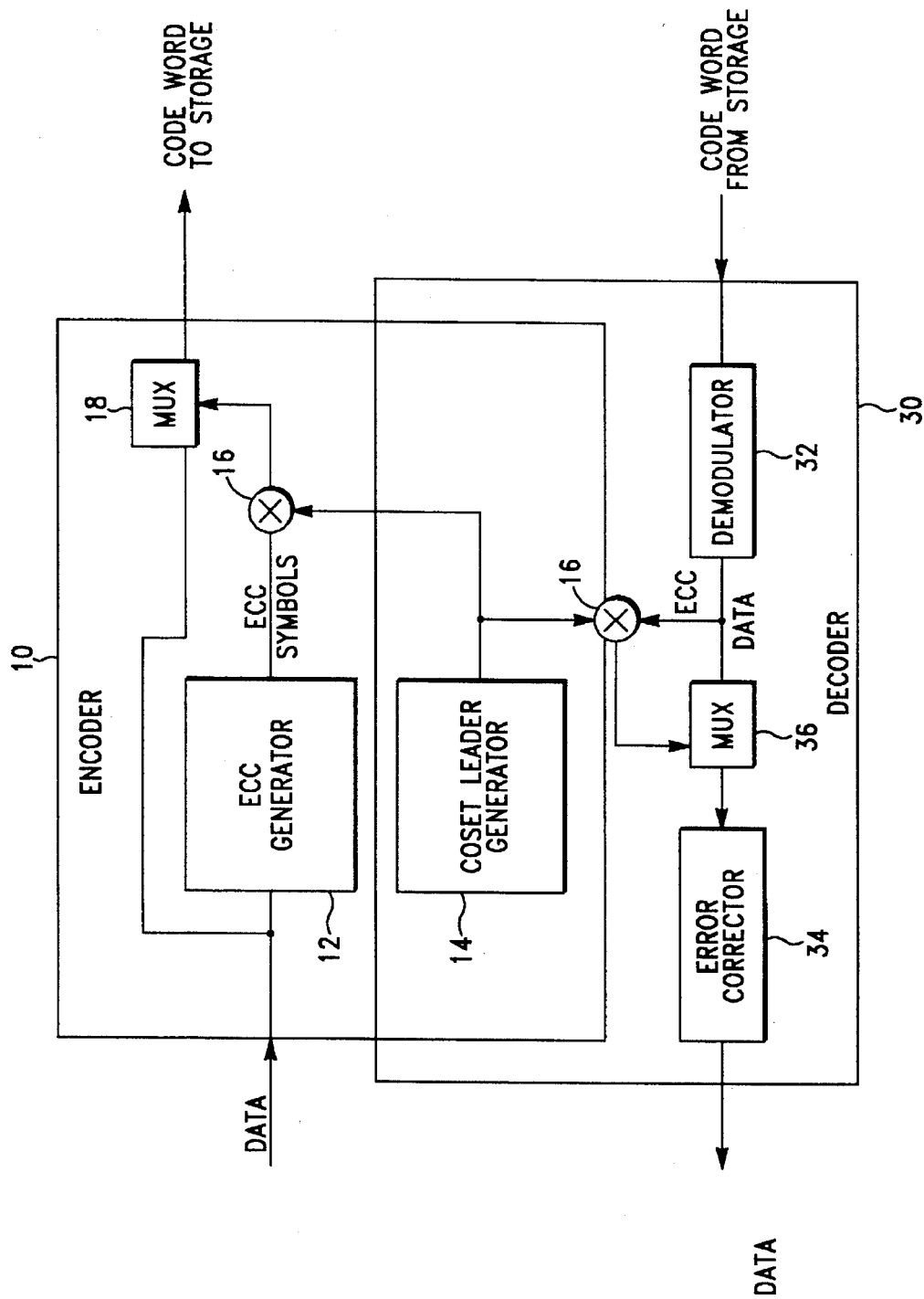
FIG. 1 is a functional block diagram of a system constructed in accordance with the invention.

Referring now to FIG. 1, an encoder 10 includes an ECC symbol generator 12 that encodes d data symbols in accordance with an ECC over $GF(2^m)$ to produce k m-bit ECC symbols. The encoder also includes a coset leader generator 14 that produces k m-bit coset leader constants. An XOR circuit 16 combines the constants with the corresponding ECC symbols, as those symbols are shifted out of the generator 12. The resulting symbols are concatenated with the d data symbols via multiplexer 18, to form a code word that is recorded on a magnetic disk (not shown).

A decoder 30 later retrieves the ECC code word from the disk and in a demodulator 32 reproduces the d data symbols and the k ECC symbols. As the ECC symbols are shifted out of the demodulator 32 they are XOR'd in XOR circuit 16 with the coset leader constants that are produced by a coset leader generator 14. The XOR circuit 16 thus removes the coset leader from the retrieved code word. Assuming there is no mis-synchronization, an error corrector 34 manipulates in a conventional manner the data symbols and the ECC symbols concatenated thereto via multiplexer 36 to correct, as necessary, any errors in the code word.

If there is a mis-synchronization, the attempted removal of the coset leader results in the introduction into the code word of an uncorrectable number of errors. The error corrector 34 thus does not attempt to correct the code word. It instead signals a system controller (not shown) that the code word is uncorrectable. The controller may then request that the code word again be retrieved from storage. The decoder will thus not inaccurately correct information that was retrieved when the head that read the information was out of synchronism with the stored information.

Figure 2:
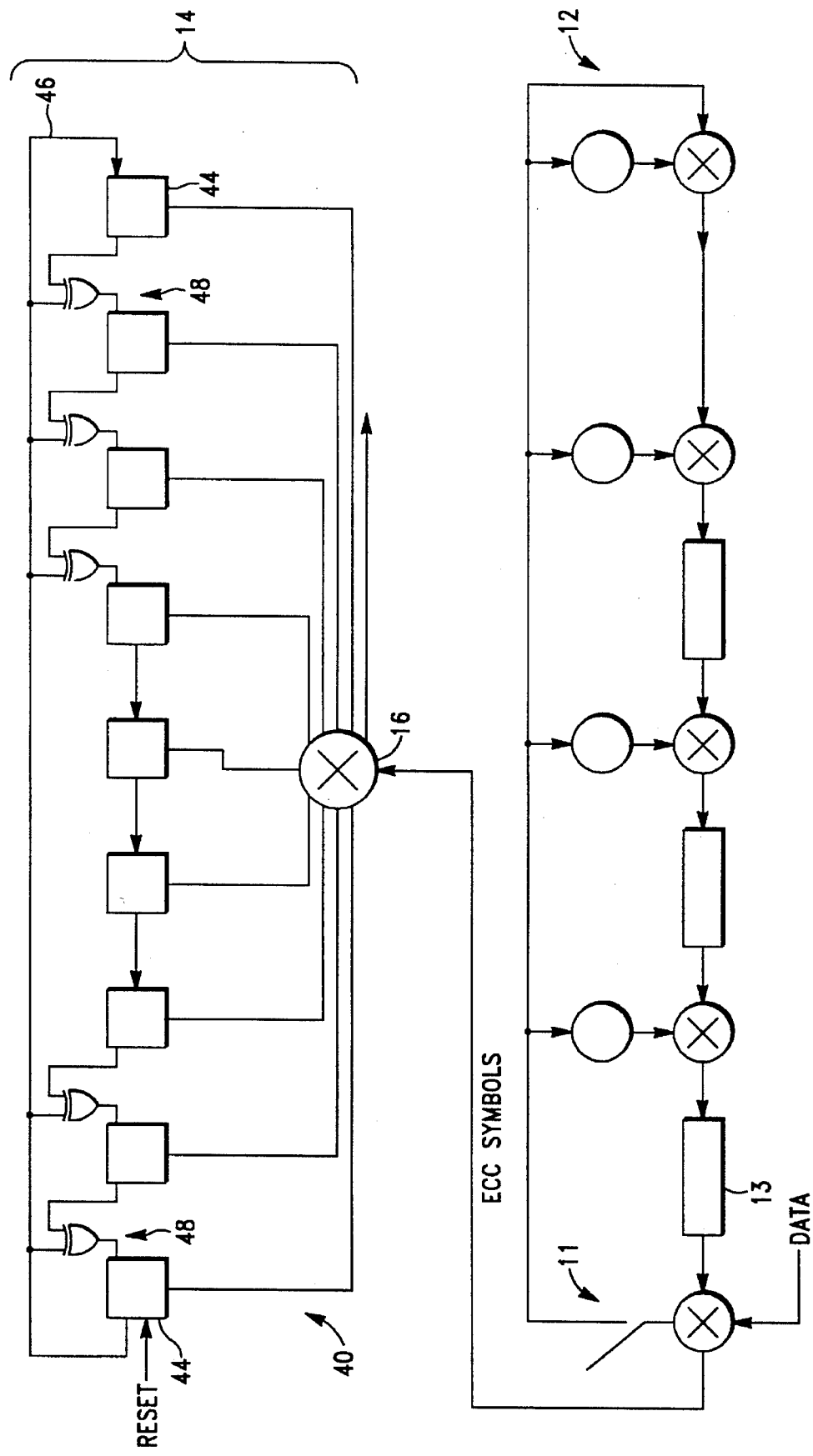
FIG. 2 is a functional block diagram that depicts in more detail an ECC symbol generator and a coset leader generator of FIG. 1.

Referring now to FIG. 2, the coset leader generator 14 consists of a linear feedback shift register (LFSR) 40 that is hardwired to contain, when reset is enabled, the initial coset leader constant. The LFSR 40 has m stages 44 and a feedback path 46 that combines, in XOR gates 48, the contents of selected stages and supplies the combinations to other stages as update values. For ease of understanding, the reset line is shown in the drawing as an arrow and the clock line is omitted.

In the preferred embodiment the LFSR 40 has nine stages (m=9) and is set up in accordance with the maximum length polynomial $X^9+X^8+X^7+X^3+X^2+1$ over $GF(2^9)$. The initial coset leader constant is 100001011. When the RESET line is asserted, the LFSR 40 is set to the its initial state, with the contents of each stage 44 forming the first coset leader constant. Each shift of the register thereafter changes the state of the register and produces in the stages 44 a new 9-bit coset leader constant. After k−1 shifts of the register, the LFSR 40 has produced a series of k 9-bit symbols (k $2<^m$) that resembles a random sequence.

The sequence produced by the LFSR 40 has the property that XOR'ing it with a shifted version of itself produces another random sequence. Accordingly, a mis-synchronization of even an integral number of symbols results in the decoder introducing an uncorrectable number of errors when it attempts to remove the coset leader.

Referring still to FIG. 2, the ECC symbol generator 12 receives, with a switch 11 in the closed position, d data symbols and operates in a conventional manner to encode these symbols in accordance with the ECC, to produce k ECC symbols. When the encoding is completed, the ECC symbols are held in k registers 13. These symbols are then shifted out of the generator 12, one-by-one, while the switch 11 is in the open position.

When the first ECC symbol is shifted out of the generator 12 to the XOR circuit 16, the LFSR 40 is at the same time re-set to contain the initial coset leader constant. The contents of the k stages of the LFSR are then combined by XOR circuit 16 with the corresponding m bits of the first ECC symbol. The XOR circuit 16 preferably consists of m 2-bit XOR gates (not shown), which operate in parallel.

As the next ECC symbol is shifted out of the ECC generator 12, the LFSR 40 is also shifted and its contents again applied to XOR circuit 16, this time as the second coset leader constant. The XOR circuit 16 XOR's the constant and the ECC symbol, and produces a next symbol for recording. The two generators and the XOR circuit continue producing the various symbols and constants until all k of the ECC symbols have been combined with the corresponding coset leader constants.

In an alternative embodiment, the coset leader generator may be shifted a total of k times and the initial coset leader constant used only to initialize the LFSR, rather than as the first symbol of the coset leader. The LFSR is thus re-set before the first ECC symbol is shifted out of the generator and thereafter shifted each time the ECC symbol generator is shifted.

In another alternative embodiment, a buffer (not shown) stores the initial coset leader constant, and supplies the constant to the LFSR at the appropriate time. As desired, the buffer may contain a plurality of initial constants, so that the LFSR may be used to produce one of a number of sequences.

Referring again to FIG. 1, the decoder 30 that corresponds to the encoder 10 utilizes the same coset leader generator 14 to produce the coset leader constants that are to be removed from the retrieved code word. The generator 14 is shifted during decoding to correspond to the production of the ECC symbols by the demodulator 32. The XOR circuit 16 XOR's the coset leader constants produced by the generator 14 with the corresponding ECC symbols produced by the demodulator 32 and forwards the resulting symbols, via multiplexer 36, to the error corrector 34. Accordingly, the coset leader constants do not require buffering.

If the head that retrieved the code word was in synchronism with the stored information, the decoder removes the coset leader from the ECC symbols to which it was added. Otherwise it, in effect, XOR's the coset leader with a shifted version of itself. This produces in the ECC symbols another random sequence, which results in an uncorrectable number of errors in the code word and the code word being interpreted as corrupted.

It is surprising that an LFSR can, by k−1 changes from its initial state, produce a k-symbol coset leader that has all the necessary properties—namely, that resembles a random sequence of k symbols and, when XOR'd with a shifted version of itself, forms another random sequence. Since the coset leader can be so generated, the hardware required by the coset leader operation is significantly reduced from that required in prior known systems. This is critical because system chips are becoming more compact and more densely populated.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A data processing system including:

A. an error correction symbol generator for encoding d data symbols using an error correction code over $GF(2^m)$ and producing k m-bit error correction symbols;

B. a coset leader generator for encoding an m-bit initial coset leader constant and producing a km bit coset leader as a series of k m-bit coset leader symbols;

C. combining means for combining the k error correction symbols with the corresponding k coset leader symbols, the combining means combining the symbols and constants as they are produced, respectively, by the error correction symbol generator and the coset leader generator.

2. The data processing system of claim 1 wherein the combining means consists of one or more exclusive OR gates.

3. The data processing system of claim 1 further including a decoder, the decoder including:

a. a demodulator for producing from a received signal d data symbols and k m-bit error correction symbols;

b. a coset leader generator for encoding an m-bit initial coset leader constant and producing a km bit coset leader as a series of k m-bit coset leader symbols;

c. combining means for combining the k error correction symbols produced by the demodulator with the corresponding k coset leader symbols, the combining means combining the symbols and constants as they are produced, respectively, by the demodulator and the coset leader generator.

4. The data processing system of claim 1 wherein the coset leader generator consists of an m-stage linear feedback shift register, and the coset leader symbols are the corresponding states of the register.

5. The data processing system of claim 4 wherein the linear feedback shift register is initialized to the state corresponding to the initial coset leader constant and then shifted k−1 times to produce the k symbol sequence.

6. The data processing system of claim 4 wherein a. the error correction symbol generator encodes the data symbols using an error correction code over $GF(2^9)$; and b. the coset leader generator linear feedback shift register is characterized by the maximum length polynomial $X^9+X^8+X_7+X^3+X^2+1$ over $GF(2)$.

7. The data processing system of claim 6 wherein the m-bit initial coset leader constant is 100001011.

8. A decoder for decoding d data symbols that are encoded into a code word, which includes k m-bit error correction symbols that have been combined with a coset leader, the decoder including:

A. a demodulator for producing, from a received signal, d data symbols and k m-bit error correction symbols;

B. a coset leader generator for encoding an m-bit initial coset leader constant and producing a km bit coset leader as a series of k m-bit coset leader symbols;

C. combining means for combining the k error correction symbols produced by the demodulator with the corresponding k coset leader symbols, the combining means combining the symbols and constants as they are produced, respectively, by the demodulator and the coset leader generator.

9. The decoder of claim 8 wherein the combining means consists of one or more exclusive OR gates.

10. The decoder of claim 8 wherein the coset leader generator consists of an m-stage linear feedback shift register.

11. The decoder of claim 9 wherein the linear feedback shift register is characterized by the maximum length polynomial $X^9+X^8+X^7+X^3+X^2+1$ over $GF(2)$.

12. The decoder claim 10 wherein the m-bit initial coset leader constant is 100001011.

13. A data processing system including:

A. an error correction symbol generator for encoding d data symbols and producing k m-bit error correction symbols;

B. a coset leader generator that, from a predetermined initial state, produces a km-bit coset leader as a series of k m-bit coset leader symbols;

C. combining means for combining the k error correction symbols with the corresponding k coset leader symbols, the combining means combining the symbols and constants as they are produced, respectively, by the error correction symbol generator and the coset leader generator.

14. The data processing system of claim 13 wherein the coset leader generator consists of an m-stage linear feedback shift register, and the coset leader symbols are the corresponding states of the register.

15. The data processing system of claim 14 wherein the linear feedback shift register is shifted k times to produce the k symbol sequence.

16. The data processing system of claim 14 wherein a. the error correction symbol generator encodes the data symbols using an error correction code over $GF(2^9)$; and b. the coset leader generator linear feedback shift register is characterized by the maximum length polynomial $X^9+X^8+X^7+X^3+X^2+1$ over $GF(2)$.

17. The data processing system of claim 16 wherein the encoder is initialized to the state 100001011.

* * * * *